US006563127B2

(12) United States Patent
Lin et al.

(10) Patent No.: US 6,563,127 B2
(45) Date of Patent: May 13, 2003

(54) OPTICAL PROXIMITY CORRECTION WITH RECTANGULAR CONTACT

(75) Inventors: Shun-Li Lin, Yun-Lin Hsien (TW); Tsung-Hsien Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 176 days.

(21) Appl. No.: 09/860,420

(22) Filed: May 18, 2001

(65) Prior Publication Data

US 2002/0158214 A1 Oct. 31, 2002

(30) Foreign Application Priority Data

Apr. 26, 2001 (TW) ........................................ 90109977 A

(51) Int. Cl.$^7$ .............................................. G01N 21/86
(52) U.S. Cl. .................... 250/548; 250/221; 356/237.4; 356/237.5
(58) Field of Search ............................. 250/559.3, 548, 250/492.22, 221; 716/19–20; 257/618; 356/400–401, 375, 237.4, 237.5; 355/53, 55; 430/311, 9, 296

(56) References Cited

U.S. PATENT DOCUMENTS 6,265,121 B1 * 7/2001 Lin .............................. 430/30

* cited by examiner

Primary Examiner—David Porta
Assistant Examiner—Patrick J. Lee
(74) Attorney, Agent, or Firm—J. C. Patents

(57) ABSTRACT

An optical proximity correction method for producing a rectangular contact. The method includes representing the rectangular contact pattern required by an integrated circuit by a pair of connected hammerhead patterns and serif patterns at the inner straight corners of the hammerhead patterns. By varying the width of the connecting section of the hammerhead patterns, an optimal aspect ratio for the rectangular pattern is obtained.

11 Claims, 3 Drawing Sheets

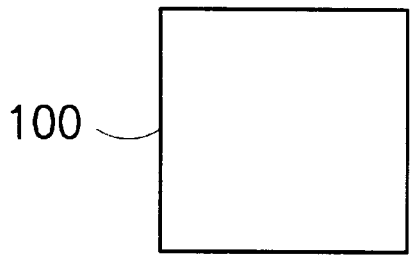
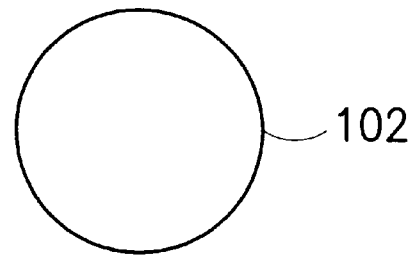
FIG. 1A
(PRIOR ART)
FIG. 1B
(PRIOR ART)
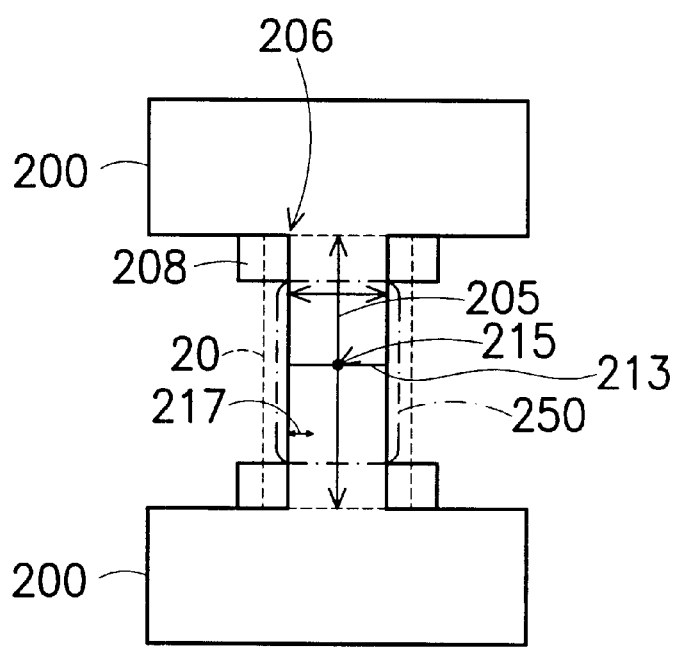
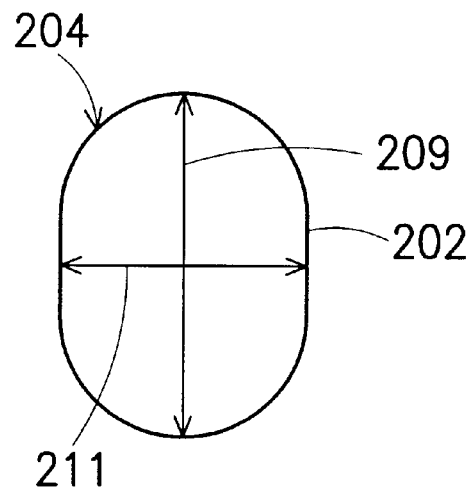
FIG. 2A
FIG. 2B

OPTICAL PROXIMITY CORRECTION WITH RECTANGULAR CONTACT

CROSS-REFERENCE TO RELATED APPLICATION

This application claims the priority benefit of Taiwan application serial no. 90109977, filed on Apr. 26, 2001.

BACKGROUND OF THE INVENTION

1. Field of Invention

The present invention relates to optical proximity correction. More particularly, the present invention relates to optical proximity correction using a rectangular contact having an increased y-x ratio.

2. Description of Related Art

As the level of integration in integrated circuits continues to increase, overall dimension of each circuit device is actually decreasing. Photolithographic process is among the most critical steps in the fabrication of quality integrated circuits. Most structures associated with a metal-oxide-semiconductor (MOS) device such as various thin film and doped regions involve a photolithographic process. In addition, further reduction of device line width so that a smaller critical dimension (CD) is obtained is very much dependent on the future development of photolithographic techniques. To meet increasingly stringent conditions, methods for increasing the resolution of a photomask keep developing. For example, optical proximity correction (OPC) and phase shift mask (PSM) are both means of increasing the critical dimension.

Optical proximity correction (OPC) is a method of reducing the proximity effect that can lead to a deviation of critical dimension (CD). The so-called proximity effect includes two related phenomena. When a light beam passes through a photomask, the light beam is diffracted and eventually causes an outward spreading. In addition, after the light beam reaches the surface of a wafer, the semiconductor substrate of the wafer reflects a portion of the incoming light back to result in some light interference. Consequently, double-exposure may occur, resulting in the over-exposure of a photoresist layer in some areas. The seriousness of such photoresist over-exposure is especially intense when the line width of a device is decreased.

A conventional optical proximity correction method can be used to improve the shape of a contact hole. FIG. 1A is a top view of a conventional optical proximity correction layout on a photomask for producing a contact. FIG. 1B is a view of the profile after exposure using the photomask shown in FIG. 1A. As shown in FIG. 1A, when the contact hole is designed to be circular, the OPC layout of the contact hole is usually a square pattern 100. As shown in FIG. 1B, the square OPC layout pattern 100 in the photomask forms a circular contact hole 102 after photo-exposure.

Although a conventional optical proximity correction that utilizes an OPC layout pattern is capable of improving contact hole profile, producing a rectangular contact pattern by the OPC method is difficult. Hence, a pattern having an optimal y-x ratio is difficult to obtain.

SUMMARY OF THE INVENTION

Accordingly, one object of the present invention is to provide an optical proximity correction for a rectangular contact capable of having a larger aspect ratio.

To achieve these and other advantages and in accordance with the purpose of the invention, the invention provides an optical proximity correction for rectangular contacts. The method involves combining two connected mirror-image hammerhead patterns and a plurality of serif patterns at the inner straight corners of the hammerhead patterns. By controlling the width of the connecting section between the hammerhead patterns, an optimal aspect ratio for the rectangular pattern is obtained. Furthermore, the actual pattern produced after photo-exposure is closer to a rectangular pattern as width of the connecting section between the pair of hammerheads is reduced.

As embodied and described herein, the invention provides an optical proximity correction method for producing a rectangular contact. The method begins by providing a first photomask with a first pattern formed thereon, wherein the first pattern has a pair of connected hammerhead patterns and a plurality of serif patterns at inner straight corners of the hammerhead patterns, with the hammerhead patterns being mirror images of each other. A first photolithographic step is performed for a first photoresist layer using the first photomask, so that a pattern correction for the first photomask is complete if the pattern on the first photoresist layer conforms to an aspect ratio of a desired rectangular pattern. Otherwise, a width of the connecting section between the hammerhead patterns in the first pattern is reduced for forming a second pattern on a second photomask. A second photolithographic step is then performed for a second photoresist layer using the second photomask. Next, the width of the connecting section is adjusted and a patterned photoresist layer is produced until a pattern on the photoresist layer conforms to the aspect ratio of the desired rectangular pattern.

In this invention, the rectangular contact pattern required by an integrated circuit is formed through a pair of opposing hammerhead pattern and a group of serif patterns. This type of optical proximity correction has greater precision for forming a rectangular contact having a larger aspect ratio than a conventional contact hold model. A wafer undergoing a photolithographic process is more capable of attaining the standard required by a product. Ultimately, both product yield and product quality is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1A is a schematic top view of a conventional optical proximity correction layout on a photomask for producing a contact;

FIG. 1B is a schematic view of the profile after exposure using the photomask shown in FIG. 1A;

FIG. 2A is a schematic top view of an optical proximity correction layout on a photomask for producing a rectangular contact according to one preferred embodiment of this invention;

FIG. 2B is a schematic view of the profile after exposure using the photomask shown in FIG. 2A;

DESCRIPTION OF THE PREFERRED EMBODIMENTS

Figure 3A:
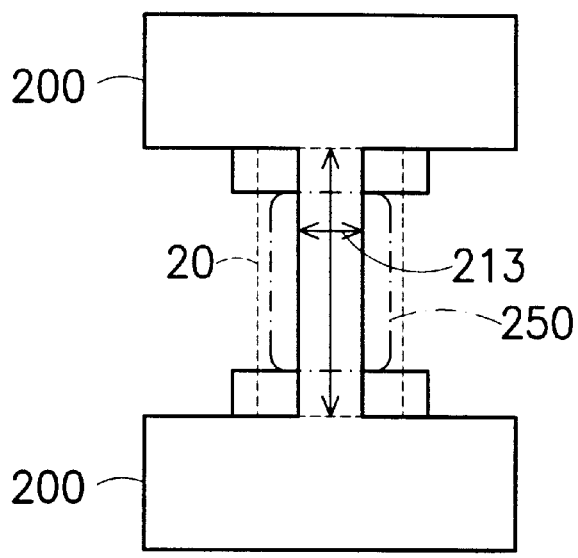
FIG. 3A is a schematic top view of another optical proximity correction layout on a photomask for producing a rectangular contact similar to the one shown in FIG. 2A.

Reference will now be made in detail to the present preferred embodiments of the invention, examples of which are illustrated in the accompanying drawings. Wherever possible, the same reference numbers are used in the drawings and the description to refer to the same or like parts.

FIG. 2A is a schematic top view of an optical proximity correction layout on a photomask for producing a rectangular contact according to one preferred embodiment of this invention. The OPC layout is a suitable photomask for exposing both positive and negative photoresists. Furthermore, the rectangular contact OPC pattern is also suitable for conducting subsequent etching, ion implantation or material filling operations.

As shown in FIG. 2A, when the contact hole is a rectangular pattern 20, the OPC layout of the contact hole comprises of a pair of connected mirror-image hammerhead patterns 200 (together forming an I-shape configuration) and a plurality of serif patterns 208 at the four inner straight corners 206 of the hammerhead patterns 200. The serif patterns 208, for example, are rectangular in pattern. The hammerhead pattern 200 improves longitudinal length 205 of the rectangular pattern 20 so that the reduction of pattern length due to optical proximity effect is minimized. The serif patterns 208 located at the four inner straight corners 206 of the two hammerhead patterns 200 reduce the arcing at the corners of the rectangular pattern 20 due to the optical proximity effect. Thus, sharper corners are obtained. The resulting rectangular pattern 202 after photo-exposure using the above OPC layout is shown in FIG. 2B.

FIG. 2B is a schematic view of the profile after exposure using the photomask shown in FIG. 2A. As shown in FIG. 2B, length 209 of the rectangular pattern 202 is not shortened due to the optical proximity effect because of the hammerhead pattern 200 in the OPC layout (shown in FIG. 2A). In addition, the serif patterns 208 are capable of sharpening the arc corners 204 of the rectangular pattern 202, which arcing is due to the optical proximity effect. Hence, overall resolution of the rectangular pattern 202 is improved.

FIG. 3A is a schematic top view of another optical proximity correction layout on a photomask for producing a rectangular contact similar to the one shown in FIG. 2A. Furthermore, the rectangular contact OPC pattern is also suitable for conducting subsequent etching, ion implantation or material filling operation.

To increase the aspect ratio of the rectangular pattern 202, or in other words, to increase the ratio between length 209 and width 211, width 213 of the connecting section 250 between the hammerhead patterns 200 must be reduced. The connecting section 250 refers to the section between the respective hammerhead patterns 200 that has no linkage with the serif patterns 208. The method of reducing width 213, for example, includes using a central position 215 in the connecting section 250 of the hammerhead patterns 200 as a base point. Both edges are then shrunk inwards from each side by a distance 217 (shown in FIG. 2A) so that width 213 of the connecting section 250 is reduced and overall area is decreased.

The the photomask pattern shown in FIG. 3A is transferred to a photoresist layer by conducting a photolithographic operation. If the pattern is correctly transferred to the photoresist layer, pattern correction of the photomask is complete. However, if the aspect ratio of the pattern on the photoresist layer is out of range, width 213 in the connecting section 250 of the pair of hammerhead pattern 200 needs to be changed. The altered pattern is transferred to the photomask so that another photolithographic operation of the photoresist layer is conducted. The aforementioned steps are repeated until the desired pattern is obtained. The resulting rectangular pattern 212 after photo-exposure using the above OPC layout is shown in FIG. 3B.

Figure 3B:
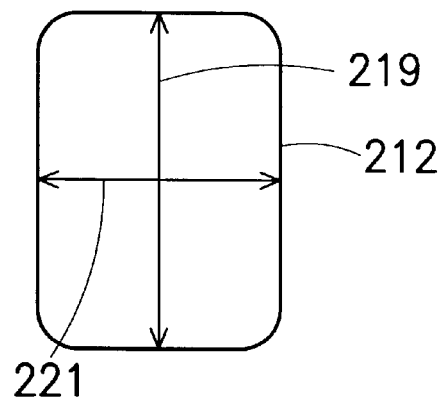
FIG. 3B is a schematic view of the profile after exposure using the photomask shown in FIG. 3A.

FIG. 3B is a schematic view of the profile after exposure using the photomask shown in FIG. 3A. Due to the shrinkage of width 213 in the connecting section 250 between the pair of hammerhead pattern 200 (shown in FIG. 3A), width 221 of the rectangular pattern 212 after photo-exposure (as shown in FIG. 3B) is smaller than width 211 of the rectangular pattern 202 (as shown in FIG. 2B). Hence, the rectangular pattern 212 produced by the photomask having an OPC layer as shown in FIG. 3A has an aspect ratio greater than the rectangular pattern 202 shown in FIG. 2B.

Figure 4A:
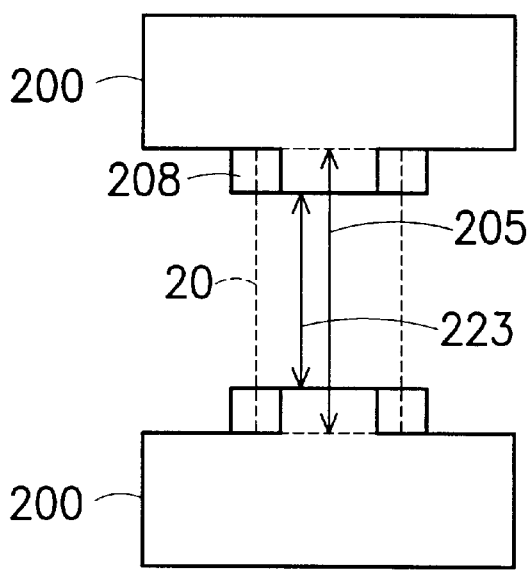
FIG. 4A is a schematic top view of yet another optical proximity correction layout on a photomask for producing a rectangular contact similar to the one shown in FIG. 2A.

FIG. 4A is a schematic top view of yet another optical proximity correction layout on a photomask for producing a rectangular contact similar to the one shown in FIG. 2A. Furthermore, the rectangular contact OPC pattern is also suitable for conducting subsequent etching, ion implantation or material filling operation.

To increase the aspect ratio of the rectangular pattern 212 (shown in FIG. 3B), or in other words, to increase the ratio between length 219 and width 221, width 213 of the connecting section 250 between the hammerhead patterns 200 must be reduced to zero. That means, the hammerhead patterns 200 are mirror images of each other but without any connection section 250. As shown in FIG. 4A, the hammerhead patterns 200 are separated from each other by a distance 223. Size of the distance 223 depends on necessary length 205 of the rectangular pattern 20. If length on the photoresist pattern is out of range, size of the distance 223 between the hammerhead pattern 200 must be altered. The altered pattern is transferred to a photomask so that another photolithographic operation of the photoresist layer is conducted. The aforementioned steps are repeated until the desired pattern is obtained. The resulting rectangular pattern 225 after photo-exposure using the above OPC layout is shown in FIG. 4B.

Figure 4B:
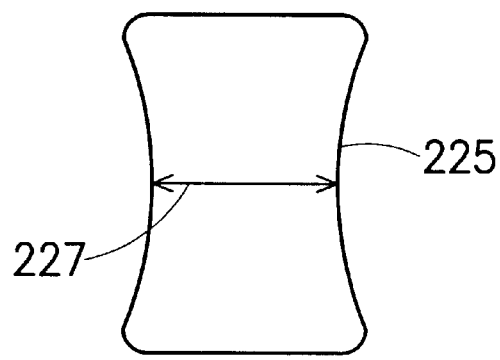
FIG. 4B is a schematic view of the profile after exposure using the photomask shown in FIG. 4A.

FIG. 4B is a schematic view of the profile after exposure using the photomask shown in FIG. 4A. Because the hammerhead patterns 200 in the OPC layout for producing the rectangular pattern 225 have no contact with each other, width 227 of the rectangular pattern 225 is smaller than width 221 of the rectangular pattern 212. Hence, the aspect ratio of the rectangular pattern 225 (shown in FIG. 4B) is greater than the aspect ratio of the rectangular pattern 212 (shown in FIG. 3B).

Figure 5A:
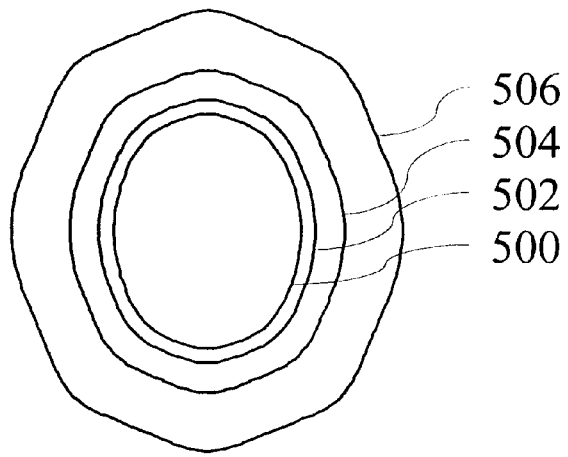
FIGS. 5A to 5C are computer-simulated post-exposure patterns corresponding to the proximity correction layouts shown in FIGS. 2A to 4A, respectively.
Figure 5B:
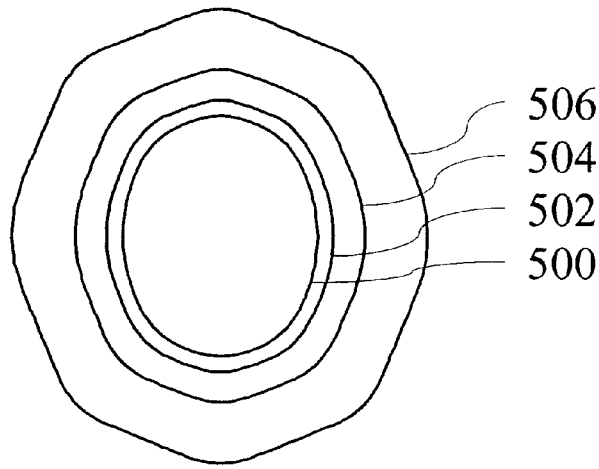
Figure 5C:
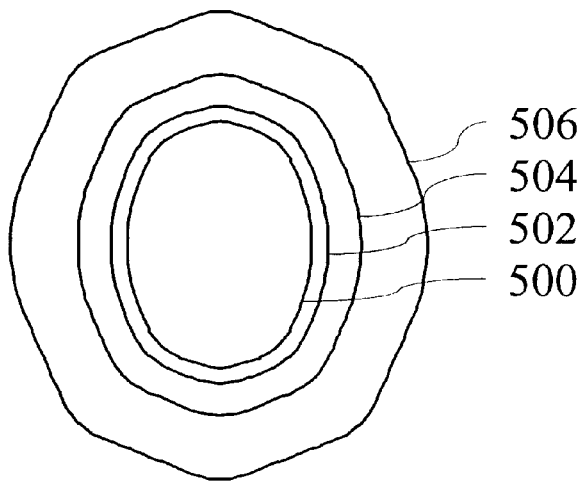

FIGS. 5A to 5C are computer-simulated post-exposure patterns corresponding to the proximity correction layouts shown in FIGS. 2A to 4A respectively. If patterns on the photomask are those shown in FIGS. 2A, 3A and 4A, the photoresist patterns after photo-exposure and development are shown in FIGS. 5A, 5B and 5C. In FIG. 2A, a width of the connecting section 250 between the hammerhead patterns is set to be 150 Å. In FIG. 3A, the width of the connecting section 250 between the hammerhead patterns is set to be 50 Å. In FIG. 4A, the hammerhead sections are disconnected. Various circular lines 500, 502, 504 and 506 in FIGS. 5A to 5C represents thickness distribution of the photoresist layer after photoresist development. The portion inside the circular line 500 shows the pattern when the thickness distribution of the photoresist layer is under 600 Å. The portion between the circular line 500 to the circular line 502 shows the pattern when the thickness distribution of the photoresist layer is about 600 Å–1200 Å. The portion between the circular line 502 and the circular line 504 shows the pattern when the thickness distribution of the photoresist layer is about 1200 Å–2400 Å. The portion between the circular line 504 and the circular line 506 shows the pattern when the thickness distribution of the photoresist layer is about 2400 Å–4800 Å. Finally, the portion outside the circular line 506 shows the pattern when the thickness distribution of the photoresist layer is identical to the one before photoresist development. The simulated result in FIG. 5A indicates an aspect ratio of 1.18, the simulated result in FIG. 5B indicates an aspect ratio of 1.26 and the simulated result in FIG. 5C indicates an aspect ratio of 1.44. This confirms that the greater the reduction 217 in the width 213 (shown in FIG. 2A and FIG. 3A) of the connecting section 250 between the hammerhead pattern 200, the larger the aspect ratio of the ultimately produced pattern will be. For disconnected hammerhead patterns 200 (as shown in FIG. 4A), rectangular pattern having a larger aspect ratio as shown in FIG. 5C is still obtained.

In conclusion, major aspects of this invention include:

1. The OPC layout of this invention is constructed from a pair of hammerhead patterns together with serif patterns. The OPC layout is capable of increasing the aspect ratio of a rectangular contact and producing a contact hole with a more accurate shape.
2. Utilizing a pair of hammerhead patterns and serif patterns to produce the OPC layout, length of a rectangular contact will not contract due to optical proximity effect. Furthermore, the serif patterns is capable of sharpening the arcs at the corners of a rectangular pattern due to optical proximity effect, thereby increasing the overall resolution of the rectangular pattern.
3. By controlling the width of the connecting section in an OPC layout, an optimal aspect ratio for the rectangular pattern is obtained. A pattern having a high aspect ratio is still obtained even if the hammerhead patterns are disconnected.
4. This invention enables a wafer that have undergone photo-exposure and development to produce a product that meets the desired product specification with fewer product failures, thereby increasing product yield and productivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical proximity correction method for producing a rectangular contact, comprising:
    providing a first photomask;
    forming a first pattern on the first photomask, wherein the first pattern comprises of a pair of connected hammerhead patterns and a plurality of serif patterns at inner straight corners of the hammerhead patterns, and the hammerhead patterns are mirror images of each other;
    performing a first photolithographic step for a first photoresist layer using the first photomask, so that the pattern correction of the first phototmask is complete if the pattern on the first photoresist layer conforms to an aspect ratio of a desired rectangular pattern;
    reducing a width of the connecting section between the hammerhead patterns in the first pattern for forming a second pattern if the pattern on the first photoresist layer does not conform to the aspect ratio of the desired rectangular pattern;
    forming the second pattern on a second photomask;
    performing a second photolithographic step for a second photoresist layer using the second photomask; and
    adjusting the width of the connecting section and producing a patterned photoresist layer until a pattern on the photoresist layer conforms to the aspect ratio of the desired rectangular pattern.

2. The optical proximity correction method of claim 1, wherein reducing the connecting section of the hammerhead pattern in the first pattern includes using the central location of the connecting section between the hammerhead patterns as a base point and moving each side inward a predetermined distance towards the base point.

3. The optical proximity correction method of claim 1, wherein a range of distance reduction includes reducing the width of the connecting section of the hammerhead patterns to zero.

4. The optical proximity correction method of claim 1, wherein the pattern on a photomask is used for exposing either a positive or negative photoresist.

5. The optical proximity correction method of claim 1, wherein the serif patterns include a rectangular shape.

6. The optical proximity correction method of claim 1, wherein the pattern is used in a subsequent etching operation.

7. The optical proximity correction method of claim 1, wherein the pattern is used in a subsequent ion implantation operation.

8. The optical proximity correction method of claim 1, wherein the pattern is used in a subsequent material filling operation.

9. An optical proximity correction pattern for producing a rectangular contact for use in a subsequent etching operation, ion implantation or material filling operation, comprising:
    a pair of hammerhead patterns, wherein the hammerhead patterns are mirror image of each other; and
    a plurality of serif patterns located at inner straight corners of the hammerhead patterns.

10. The correction pattern of claim 9, wherein the optical proximity correction pattern on a photomask is used to photo-expose either a positive or negative photoresist.

11. The correction pattern of claim 9, wherein the serif patterns include a rectangular shape.

* * * * *